(12) United States Patent
Lee et al.

(10) Patent No.: US 6,743,695 B2
(45) Date of Patent: Jun. 1, 2004

(54) SHALLOW TRENCH ISOLATION METHOD AND METHOD FOR MANUFACTURING NON-VOLATILE MEMORY DEVICE USING THE SAME

(75) Inventors: Seong-Soo Lee, Seongnam-si (KR); Jae-Seung Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/353,635

(22) Filed: Jan. 29, 2003

(65) Prior Publication Data

US 2003/0199149 A1 Oct. 23, 2003

(30) Foreign Application Priority Data

Apr. 18, 2002 (KR) ................................. 2002-0021320

(51) Int. Cl.7 ............................................. H10L 21/76
(52) U.S. Cl. ...................... 438/439; 438/445; 257/374
(58) Field of Search ................. 438/257–259, 438/637–638, 672–675, 294–296, 362, 439; 257/374

(56) References Cited

U.S. PATENT DOCUMENTS 6,013,551 A    1/2000  Chen et al. .................. 438/264
6,495,467 B2 * 12/2002  Shin et al.
6,586,804 B2 *  7/2003  Choi et al.

* cited by examiner

*Primary Examiner*—Dung A. Le
(74) *Attorney, Agent, or Firm*—Mills & Onello, LLP (57) ABSTRACT

In a method for shallow trench isolation and a method for manufacturing a non-volatile memory device using the same, a hard mask layer pattern, a stopper layer pattern and an oxide film pattern are formed by patterning a hard mask layer, a stopper layer and an oxide film. A trench is formed by etching an upper portion of a substrate adjacent to the stopper layer pattern with the hard mask layer pattern. After removing the hard mask layer, a field oxide layer is formed in the trench. After etching the trench with the hard mask, the aspect ratio of the trench region is reduced by removing the hard mask prior to filling the trench, enhancing the gap filling margin of the trench fill process.

13 Claims, 11 Drawing Sheets

SHALLOW TRENCH ISOLATION METHOD AND METHOD FOR MANUFACTURING NON-VOLATILE MEMORY DEVICE USING THE SAME

BACKGROUND OF THE INVENTION

1. Field of the Invention

The present invention relates to an isolation method and a method for manufacturing a semiconductor device using the same, more particularly to a shallow trench isolation method and method for manufacturing a non-volatile memory device using the same.

2. Description of the Related Art

In manufacturing a highly integrated memory device, the integration density of a memory cell is determined according to the layout of the memory cell and scalability of the layout, and depends upon the reduction of the critical dimension. As the critical dimension is reduced below sub-micron scale, the scalability of the layout is limited by the resolution of manufacturing process and alignment tolerance of the layout mask. The alignment of the mask is limited according to the technique used for mechanically placing the mask over a wafer and the technique used for forming a consistent pattern on the mask. If the alignment tolerance is accumulated, a misalignment error occurs in the array layout. Therefore, less reliance of alignment using a critical mask is preferable in order to control alignment tolerance on chip design. Therefore, a self-aligned process wherein the critical mask is not used has been developed.

Since highly-integrated memory design commonly requires an isolation structure between cells of a row direction in an array, it is preferable to minimize the dimension of the isolation structure in order to increase the integrity of the memory array. However, the size of the isolation structure is defined by the process for forming the isolation structure and the alignment of the memory array structure.

Generally, the isolation structure is formed using a thermal field oxidation process such as local oxidation of silicon (LOCOS). According to LOCOS isolation, a nitride film is patterned after forming an oxide film and a nitride film sequentially on a silicon substrate. Then, using the patterned nitride film as an oxidation prevention mask, a field oxide film is formed by selectively oxidizing the silicon substrate. According to LOCOS isolation, as oxygen penetrates into a side of the oxide film, a bird's beak structure is generated at end portions of the field oxide film. This can lead to a decrease in the available length of the active region, and consequently, the electrical characteristics of the element are adversely affected.

For this reason, and others, in VLSI semiconductor devices, shallow trench isolation structures draw a great deal of attention. According to the shallow trench isolation process, a trench is formed by etching a silicon substrate and an oxide film is deposited in order to fill the trench. Then, a field oxide film is formed in the trench by etching the oxide film to remove those portions that are not part of the trench, for example, by an etch back process or a chemical mechanical polishing process.

The above-mentioned LOCOS method or shallow trench isolation method includes a mask process and a field oxide film forming process in order to define the isolation region. After forming an isolation structure, a mask process for forming memory cells is performed. Therefore, in view of the alignment tolerance when forming an isolation structure with respect to the alignment tolerance of the memory cell layout, a misalignment can occur that may critically affect operation of the resulting elements.

In addressing the above alignment problems, a method for forming a LOCOS isolation structure that self-aligns with the floating gate in a non-volatile memory device has been developed. Further, a method for forming a shallow trench isolation that self-aligns with a floating gate is disclosed in U.S. Pat. No. 6,013,551. The above methods provide for self-alignment between the active region and the floating gate because the floating gate and the active region that are used in storing electric charge are defined simultaneously using one mask.

Non-volatile memory devices, for example flash memory, offer the advantage of maintaining data state, even when power is removed. Since such devices find application in a range of products, demand for flash memory that enables electronic data to be inputted/outputted continues to increase.

Memory cells for storing data in flash memory device include a floating gate formed on a silicon substrate. A tunnel oxide film is interposed between the silicon substrate and the floating gate and a stack type gate structure of control gate is formed on the floating gate where a dielectric film is interposed between the floating gate and the control gate. In a flash memory device having the above-mentioned structure, data are stored by applying appropriate voltage to the control gate and the substrate to introduce electrons to the floating gate or to extract electrons from the floating gate. At this time, the dielectric film maintains an electric charge characteristic charged on the floating gate and transmits the voltage of the control gate to the floating gate.

FIG. 1A to FIG. 1E are cross-sectional views illustrating a conventional self-aligned shallow trench isolation method applied to non-volatile memory device.

Figure 1A:
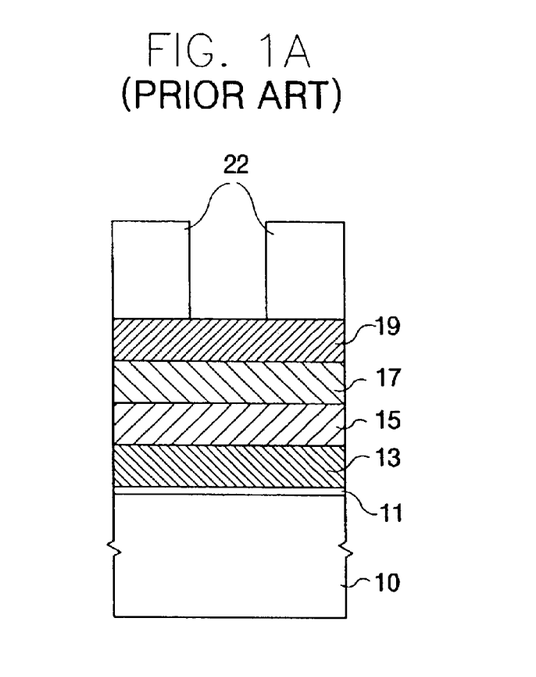
FIGS. 1A to 1E are cross-sectional views illustrating a conventional self-aligned shallow trench isolation method applied to a non-volatile memory device.

Referring to FIG. 1A, an oxide film 11 having a thickness of 90 Å and a first polysilicon layer 13 having a thickness of 400 Å are deposited sequentially on a semiconductor substrate 10 such as a silicon substrate. The oxide film is provided for forming a tunnel oxide film, in other words for a gate oxide film of a memory cell, and the first polysilicon layer is provided for forming a floating gate.

A stopper layer 15 comprised of silicon nitride is formed on the first poly silicon layer 13 so as to have a thickness of 600 Å, and then, a hard mask layer 17 comprised of oxide is formed on the stopper layer 15 so as to have a thickness of 500 Å. An anti-reflection layer 19 is deposited on the hard mask layer 17 to have a thickness of 800 Å.

Then, a photoresist pattern 22 is formed on the anti-reflection layer 19 in order to define an active region.

Figure 1B:
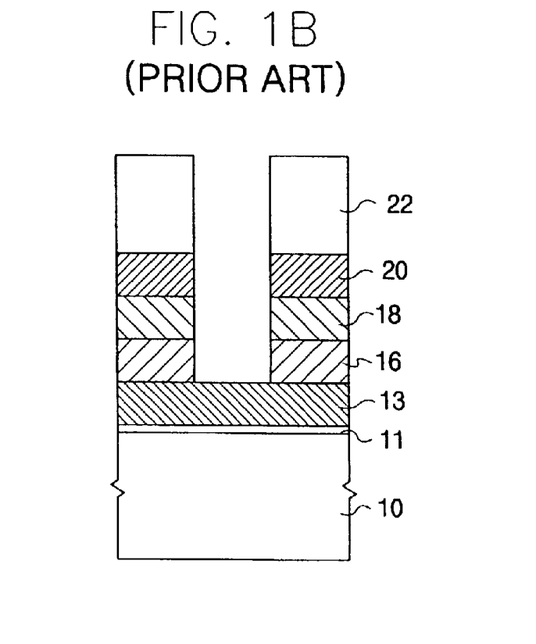

Referring to FIG. 1B, an anti-reflection layer pattern 20, a hard mask layer pattern 18, a stopper layer pattern 16 are formed by sequentially dry etching the anti-reflection layer 19, the hard mask layer 17 and the stopper layer 15 using the photoresist pattern 22 as an etching mask.

Figure 1C:
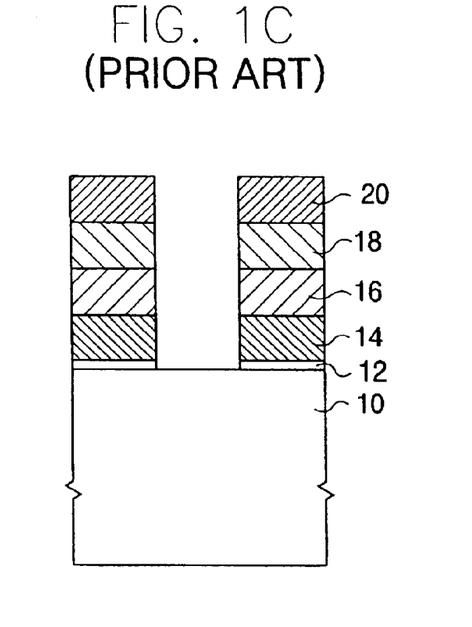

Referring to FIG. 1C, after removing the photoresist pattern 22 by an ashing or a stripping process, the first floating gate 14 and a gate oxide film 12 are formed by sequentially dry etching the first poly silicon layer 13 and the oxide film 11 using the hard mask layer pattern 18 as an etching mask.

Figure 1D:
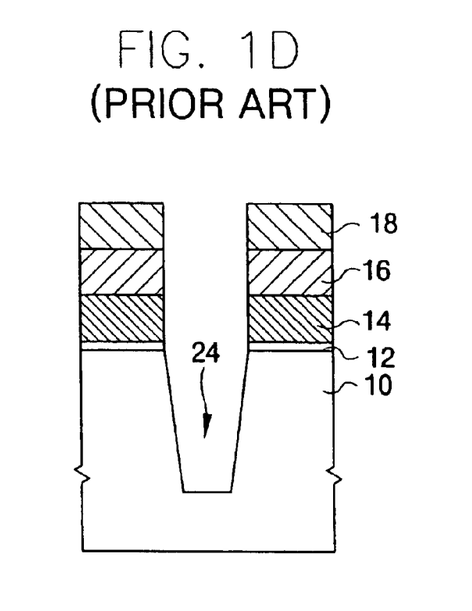

Referring to FIG. 1D, a trench 24 is formed by etching the upper part of the substrate 10 adjacent to the first floating gate 14 to have a depth of 2300 Å using the hard mask pattern 18 as an etching mask. At this time, the anti-reflection layer pattern 20 is removed by etching.

Figure 1E:
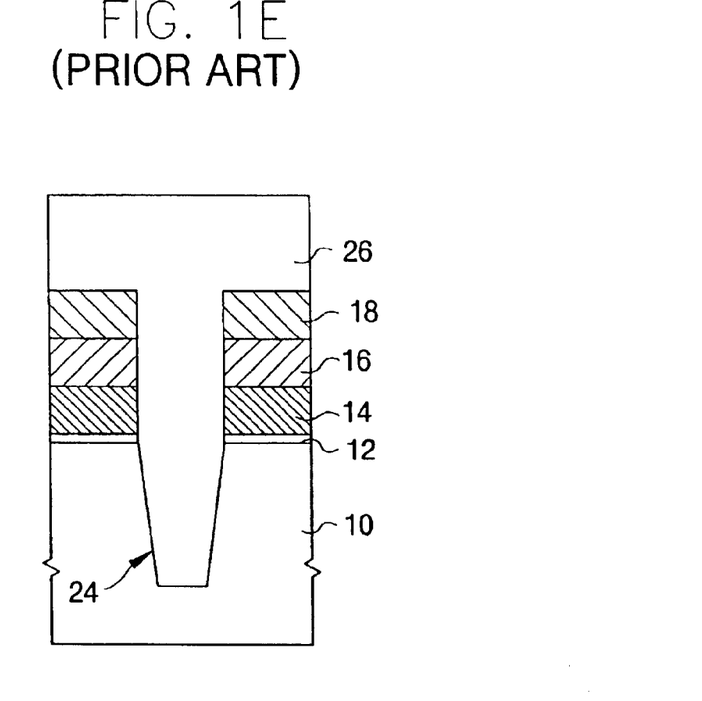

Referring to FIG. 1E, a gap-fill oxide film 26 is formed using CVD method in order to fill the trench 24. Then, a field oxide film is formed in the trench 24 by removing the gap-fill oxide film 26 using CMP until the upper surface of the stopper layer pattern 16 is exposed.

In the case of a memory device to which the above described shallow trench isolation process is applied, as the design-rule decreases, the depth of the trench also decreases, which in turn can cause isolation failure. In order to prevent this failure, if the depth of the trench is increased, an aspect ratio of trench region becomes large and, consequently, voids occur during the gap-filling process.

An etching method using a photoresist mask and an etching method using a hard mask are generally used for forming a trench by etching. In case of the latter, as there is a limit to the degree that the thickness of the stopper layer composed of nitride can be decreased, trench etching is performed using a hard mask comprising oxide or silicon oxynitride. At this time, since the gap-fill oxide layer is deposited in such a state that the thickness of the hard mask layer on the stopper layer is 400 Å, the aspect ratio of the trench region becomes greater. In addition, in such a structure that the first polysilicon layer for the floating gate exists under the stopper layer, the aspect ratio of the trench region increases greater and, as a result, voids occur during the gap filling process. In order to prevent the void occurrence, the aspect ratio is preferably made to be lower than 2.2. However, according to above-mentioned conventional methods, it is practically difficult to increase the trench depth by more than 2000 Å. As a result, isolation failures commonly occur.

SUMMARY OF THE INVENTION

In order to address the above-mentioned limitations, it is a first object of the present invention to provide a shallow trench isolation method that can ensure the gap-filling margin of the trench.

It is a second object of the present invention to provide a method for manufacturing a non-volatile memory device that can ensure the gap-filling margin of the trench.

In order to achieve the first object of the present invention, there is provided a shallow trench isolation method wherein an oxide film is formed on a semiconductor substrate. After forming a stopper layer on the oxide film, a hard mask layer is formed on the stopper layer. A hard mask layer pattern, a stopper layer pattern and an oxide film pattern are formed via patterning the hard mask layer, the stopper layer and the oxide film. Then, a trench is formed by etching an upper portion of the substrate using the hard mask layer pattern as an etching mask. After removing the hard mask layer, a field oxide film is formed in the trench.

In order to achieve the second object of the present invention, there is provided a method for manufacturing a non-volatile memory device wherein an oxide film for a gate oxide film is formed on a semiconductor substrate. After forming a first conductive layer for a floating gate on the oxide film, a stopper layer is formed on the first conducing layer. A hard mask layer is formed on the stopper layer. A hard mask layer pattern and a stopper layer pattern are formed via patterning the hard mask layer and the stopper layer. After forming a first floating gate pattern and a gate oxide film by etching the first conductive layer and the oxide layer using the hard mask layer pattern as an etching mask, an active region of the substrate is defined by etching the substrate to form a trench aligned with the first floating gate pattern. After forming a trench aligned to the first floating gate pattern by using the hard mask layer pattern as an etching mask, the hard mask layer pattern is removed. A field oxide film is formed in the trench; and a dielectric film and a control gate layer are sequentially formed on the first floating gate pattern.

According to the present invention, since the hard mask layer which exists on the stopper layer is removed prior to deposit of the gap filling oxide film, an improved gap filling margin can be obtained by decreasing the aspect ratio of the trench region. Therefore, gap filling without voids can be accomplished and occurrence of an isolation failure can be prevented by increasing the depth of the trench.

BRIEF DESCRIPTION OF THE DRAWINGS

The above and other advantages of the present invention will become more apparently by describing in detail an exemplary embodiment thereof with reference to the accompanying drawings, in which:

FIGS. 3A to 3I are cross-sectional views illustrating a method for manufacturing a non-volatile memory device where a self-aligned shallow trench isolation process according to a preferred embodiment of the present invention is applied.

DETAILED DESCRIPTION OF PREFERRED EMBODIMENTS

FIGS. 2A to 2G are cross-sectional views illustrating a shallow trench isolation method according to an embodiment of the present invention.

Figure 2A:
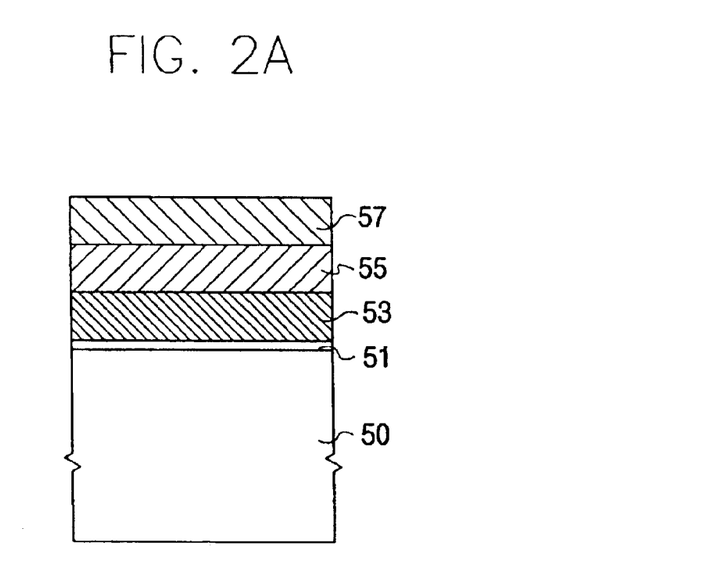
FIGS. 2A to 2G are cross-sectional views illustrating a shallow trench isolation method according to an embodiment of the present invention.

Referring to FIG. 2A, a silicon oxide layer 51 which is provided as a pad oxide layer is grown on a semiconductor substrate 50 that comprises a material such as silicon, and then stopper layer 53 is formed on the silicon oxide layer 51 by depositing silicon nitride. The stopper layer 53 functions as a polishing endpoint detection layer during a subsequent CMP process.

After a hard mask layer 55 is formed via depositing an oxide on the stopper layer 53, an anti-reflective layer 57 is formed on the hard mask layer 55. The anti-reflective layer 57 prevents light from being reflected from the substrate during a subsequent photolithography process, so that a photoresist pattern may be easily formed. The anti-reflective layer 57 is, for example, comprised of silicon oxynitride (SiON), an organic material, or other suitable material.

Figure 2B:
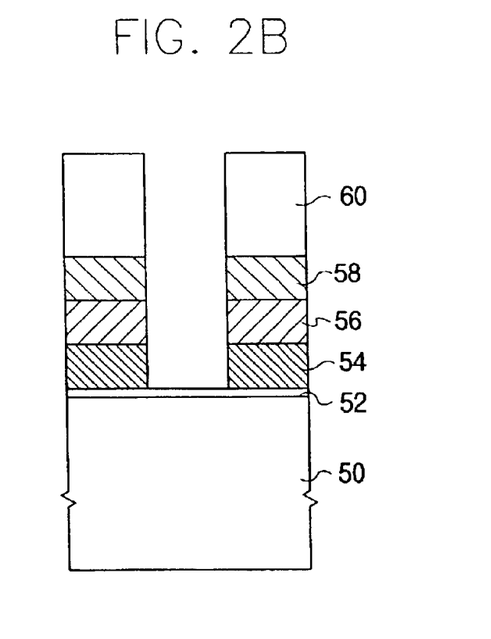

Referring to FIG. 2B, a photoresist film is formed by coating a photoresist material on the anti-reflective layer using a spin coating method. Then, a photoresist pattern 60 defining an active region is formed through exposing and developing the photoresist film using a photomask.

An anti-reflective layer pattern 58, a hard mask layer pattern 56, a stopper layer pattern 54 and an oxide film pattern 52 are formed by dry etching the anti-reflective layer 57, the hard mask layer 55, the stopper layer 53 and the oxide film 51 sequentially with the photoresist pattern 60 as an etching mask.

Figure 2C:
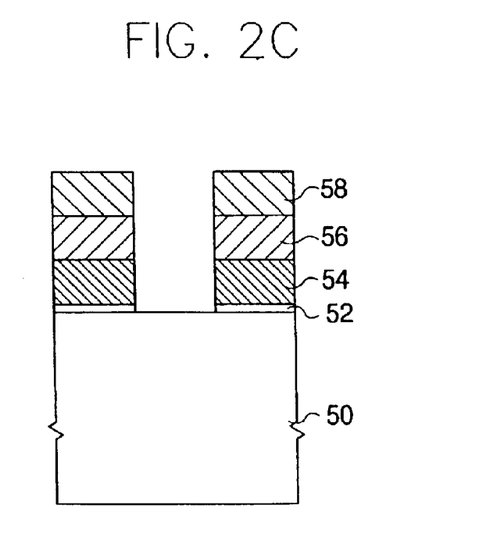

Referring to FIG. 2C, the photoresist pattern 60 is removed through ashing and strip processes.

Figure 2D:
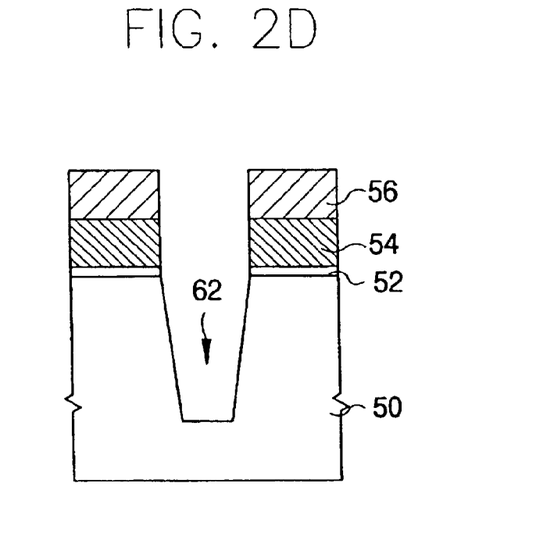

Referring to FIG. 2D, a trench 62 is formed by etching an upper portion of the substrate 50 adjacent to the stopper layer 54 using the hard mask pattern 56 as an etching mask. At this time, during the trench etching process, the anti-reflective layer pattern 58 formed on the hard mask pattern 56 is removed.

Figure 2E:
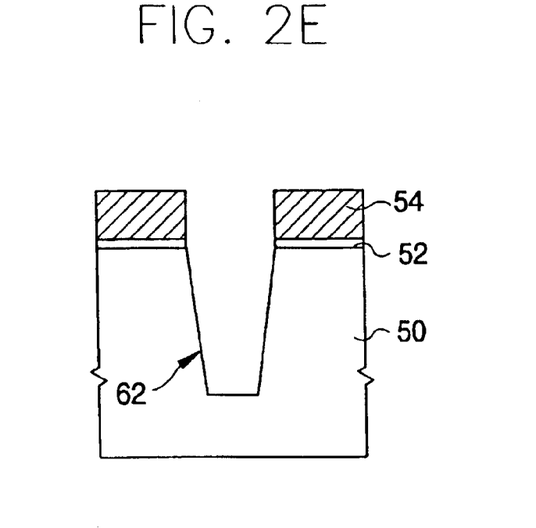

Referring to FIG. 2E, an inner surface portion of the trench 62 is treated in an oxidation atmosphere in order to remove silicon damage caused by a high energy ion beam and to prevent leakage current during the trench etching process. Then, the inner surface portion of the trench, i.e. along the bottom and side surfaces thereof, a trench inner wall oxide film (not shown) is formed.

Then, the hard mask layer pattern 56 is removed in a dry etching process. When the selectivity of silicon in the dry etching process is low, the bottom profile of the trench 62 becomes sharp, and its depth can vary. Further, if the etching selectivity of the silicon nitride in the stopper pattern is low, the stopper layer pattern 54 cannot effectively function as a polishing endpoint layer. Therefore, it is preferable that the dry etching process is performed under the condition that the etching selectivity of the oxide with respect to both silicon and silicon nitride is more than about 10:1 using $C_4F_6$ gas, CO gas and Ar gas.

Further, if the hard mask layer is formed using silicon oxynitride and a separate anti-reflection layer is not formed, the hard mask layer pattern is preferably removed by a wet etching process using e.g., an HF etchant.

Figure 2F:
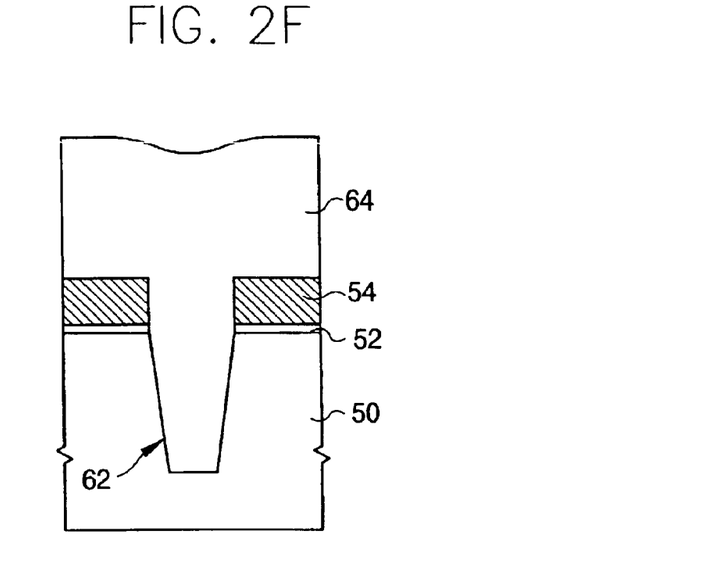

Referring to FIG. 2F, an oxide layer having an excellent gap filling characteristic such as USG (undoped silicate glass), $O_3$-TEOS USG or HDP (high density plasma) oxide layer is deposited using a chemical vapor deposition method in order to fill the trench 62. According to the preferred embodiment of the present invention, since the gap filling oxide layer 64 is deposited after the hard mask pattern 56 remaining on the stopper layer 54 is removed, the trench step can be decreased by as much as the thickness of the hard mask layer pattern 56 compared with conventional methods. Therefore, the gap can be filled without void, by decreasing the aspect ratio of the trench region lower than 2.2. Further, since the depth of the trench 62 can be increased by insuring a gap filling margin, the isolation failure can be prevented by improving isolation characteristics.

Figure 2G:
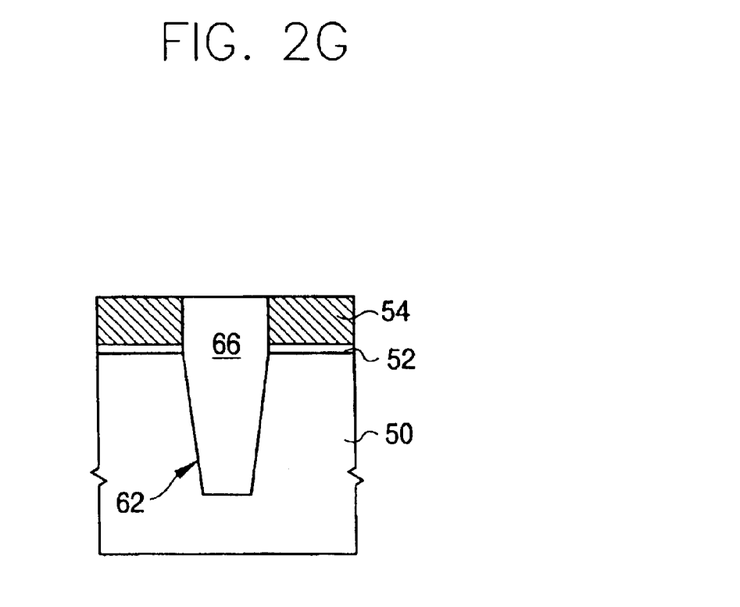

Referring to FIG. 2G, the gap filling oxide layer 64 is planarized by performing a CMP process until an upper surface of the stopper layer 54 is exposed. Then, the gap filling oxide layer 64 on the stopper layer 54 is removed and a field oxide layer 66 is formed in the trench 62.

FIGS. 3A to 3I are cross-sectional views illustrating a method for manufacturing a non-volatile memory device in a self-aligned shallow trench isolation process according to a preferred embodiment of the present invention.

Figure 3A:
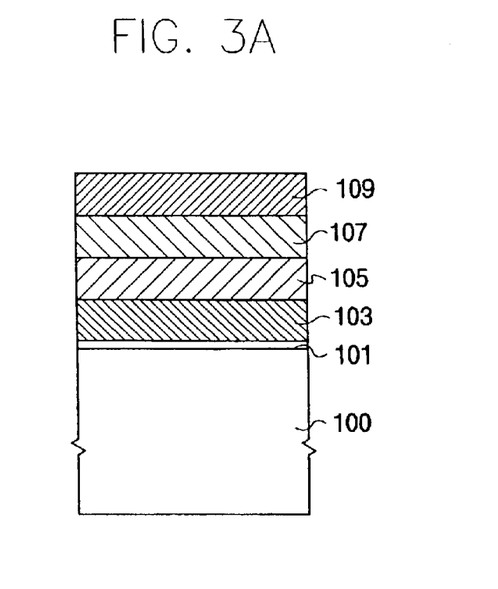

Referring to FIG. 3A, an oxide layer 101 provided as a cell transistor gate oxide layer (for example, a tunnel oxide layer) is formed to have a thickness of about 90 Å on the semiconductor substrate 100 comprised of a material such as silicon.

A first conductive layer 103 to be used for a floating gate is formed on the oxide layer 101 using a low pressure chemical vapor deposition process to have a thickness of about 200~15000 Å, preferably 400 Å, and the first conductive layer 103 is doped with high density N-type impurities using general doping methods, for example, using $POCl_3$ diffusion, ion implantation, or in-situ doping. Preferably, the first conductive layer is comprised of polysilicon or amorphous silicon.

A stopper layer 105 is formed by depositing silicon nitride on the first conductive layer 103 to have a thickness of about 100~3000 Å, preferably about 600 Å, using an LPCVD method. The stopper layer 105 functions as a polishing endpoint detecting layer during a subsequent CMP process.

A hard mask layer 107 is formed by depositing medium temperature oxide on the stopper layer 105 to have a thickness of about 200~2000 Å, preferably about 300 Å, and then an anti-reflection layer 109 is formed by depositing silicon nitride on the hard mask layer 108 to have a thickness of about 200~3000 Å, preferably about 800 Å. The anti-reflection layer 109 prevents light reflection during a subsequent photolithography process so as to facilitate photoresist pattern formation.

Figure 3B:
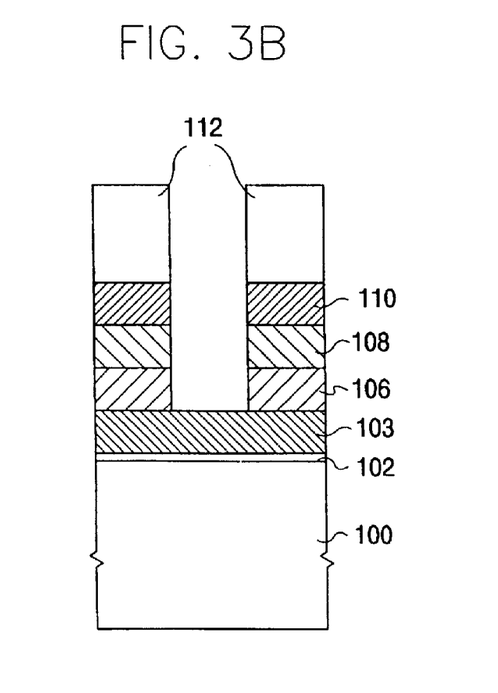

Referring to FIG. 3B, a photoresist film (not shown) is formed by coating a photoresist on the anti-reflection layer 109 using a spin coating method, and then, using the photomask, photoresist pattern 112 defining a layout of floating gate is formed by exposing and developing the photoresist film.

Then, using the photoresist pattern 112 as an etching mask, the anti-reflection pattern 110, the hard mask layer pattern 108 and the stopper layer pattern 106 are formed by dry etching the anti-reflection layer 109, the hard mask layer 107 and the stopper layer 105 sequentially.

Figure 3C:
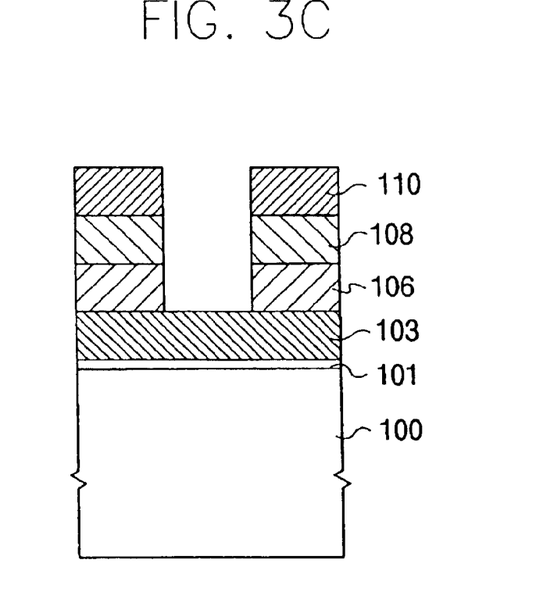

Referring to FIG. 3C, the photoresist pattern is removed through ashing and stripping processes.

Figure 3D:
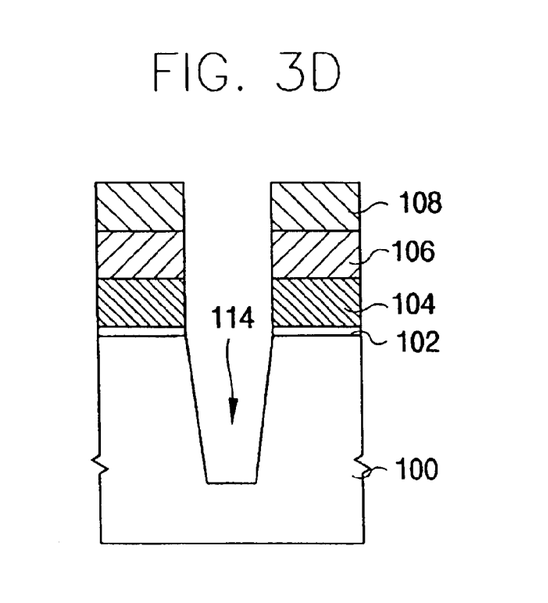

Referring to FIG. 3D, the resultant structure is moved to another etching chamber in order to perform an etching process of polysilicon and oxide. Then, by introducing etching gas for etching poly silicon and oxide into the etching chamber, the first floating gate pattern 104 is formed by etching the first conductive layer 103 using the hard mask layer pattern 108 as an etching mask.

Then, a gate oxide film 102 is formed by etching the oxide film 101 in the same etching chamber, and a trench 114 is formed by etching the substrate 100 to have a depth of about 1000~5000 Å, preferably about 2300 Å. As a result, the first floating gate pattern 104, includes gates defined by the first conductive layer 103 that are separated from each other. In other words, by forming the trench 114, as the active region and the floating gate are defined simultaneously, the first floating gate pattern 104 is self-aligned in the active region.

At this time, in process for etching the first conductive layer 103 and the substrate 100, the anti-reflection layer pattern 110 is removed and the hard mask layer pattern 108 is etched to a predetermined thickness. Therefore, the hard mask layer pattern remains on the stopper layer pattern 106 to have a thickness of about 400 Å.

Figure 3E:
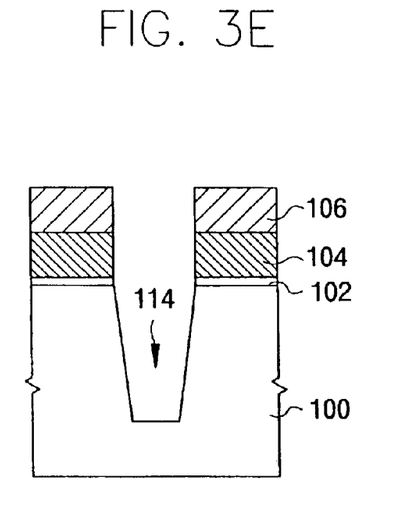

Referring to FIG. 3E, in order to remove silicon damage caused by high energy ions during the trench etching process and to prevent an occurrence of a leakage current, the inner surface of the trench 114 is treated in an oxidation atmosphere. Then, the inner surface of the trench 109, in other words the bottom surface and the side surface of the trench, is oxidized to form a trench inner wall oxide film (not shown) having a thickness of about 10~500 Å, preferably about 30 Å.

Then, the hard mask pattern 108 having a thickness of 400 Å remaining on the stopper layer pattern 106 is removed by a dry etching method. If the etching selectivity of silicon nitride is low in the dry etching process, the bottom profile of the trench 114 becomes sharp and the depth can vary. Further, if the etching selectivity of silicon nitride in the stopper layer pattern 106 is low, the stopper layer pattern cannot properly function as the polishing endpoint detecting layer. Therefore, it is preferable that the dry etching process is performed on condition that the etching selectivity of the oxide with respect to both silicon and silicon nitride is more than 10:1, preferably more than 20:1 using $C_4F_6$ gas, CO gas and Ar gas. Here, the consumed quantity of the stopper layer pattern 106 comprised of silicon nitride is lower than 60 Å.

Further, when the hard mask layer comprises silicon nitride and a separate anti-reflection layer is not formed, the hard mask pattern layer may be removed by a wet etching process using an etchant, for example, an HF type etchant.

Figure 3F:
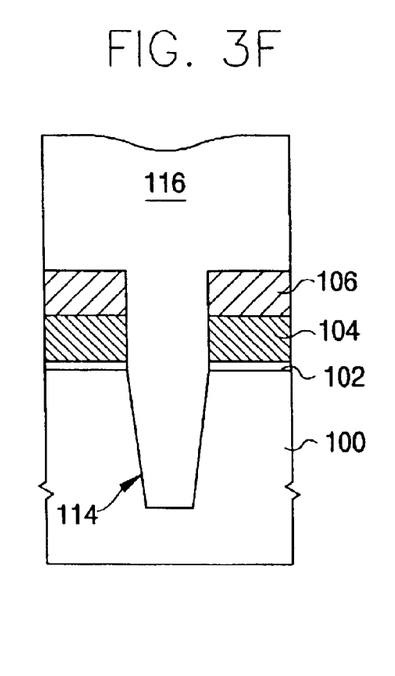

Referring to FIG. 3F, in order to fill the trench 114, an oxide film 116 having an excellent gap filling characteristic such as USG, $O_3$-TEOS or HDP is deposited by a CVD method. Preferably, the gap filling oxide film is formed by depositing an HDP oxide layer using $SiH_4$, $O_2$ and Ar gas as a plasma source. According to an embodiment of the present invention, since the gap filling oxide layer 116 is deposited after the hard mask layer pattern 108 having a thickness of about 400 Å remaining on the stopper layer is removed, the trench step decreases by 400 Å, as compared to the conventional method. Therefore, the aspect ratio of the trench region decreases by 0.25, as compared to a conventional method, and gap filling without void can be accomplished. Further, as the trench 114 depth can be increased by 2500 Å by obtaining a gap filling margin, separation failure can be prevented by improving separation characteristics.

Figure 3G:
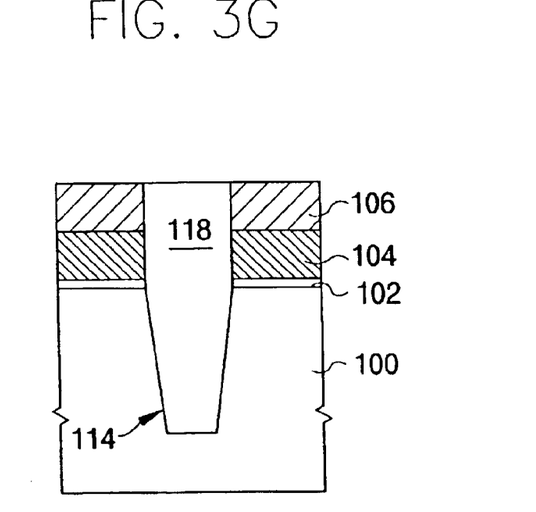

Referring to FIG. 3G, the gap filling oxide film 116 is planarized until the upper surface of the stopper layer pattern 106 is exposed using a CMP process. Therefore, the gap tilling oxide layer 116 on the stopper layer pattern 106 is removed and a field oxide layer 118 is formed only inside the trench 114.

Figure 3H:
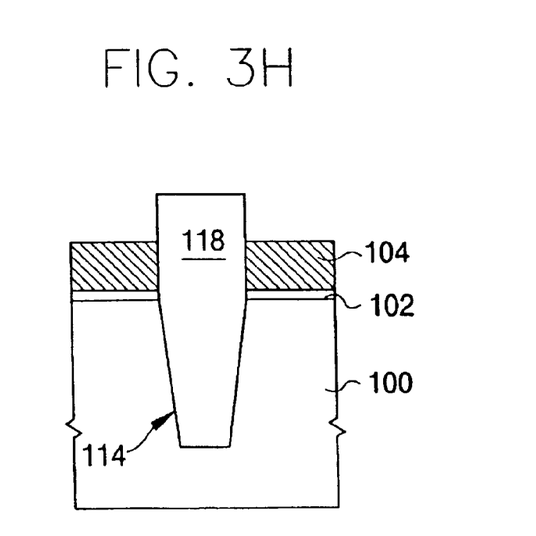

Referring to FIG. 3H, the stopper layer pattern 106 comprised of silicon nitride is removed by a phosphoric acid strip process. Then, a process for pre-cleaning the substrate is performed for 30 seconds with an etchant including hydrofluoric acid. The field oxide film 118 is removed to a predetermined thickness through the above strip process for the stopper layer pattern 106 and the pre-cleaning process.

Referring to FIG. 3I, a second conductive layer such as a polysilicon layer or an amorphous silicon layer is deposited on the exposed first floating gate pattern 104 and field oxide film 118 so as to have a thickness of more than about 2000 Å. The second conductive layer is formed so as to make electrical contact with the first floating gate pattern 104. Then, the second conductive layer is doped with high density N-type impurities using a general doping method, for example, $POCl_3$ diffusion, ion infusion, or in-situ doping. Further, without a separate doping process, the second conductive layer may be formed by implanting N-type impurities and depositing doped polysilicon with impurities in a CVD method. The second floating gate formed from the second conductive layer is formed in order to increase the surface of a dielectric film in a subsequent process. Therefore, it is preferable that the second floating gate is formed to be as thick as possible.

Then, the second conductive layer on the field oxide film 118 is removed partially in a general photolithography process to thereby form a second floating gate pattern 120. The second floating gate patterns 120 are separated from the floating gates of adjacent cells.

In order to completely insulate the second floating gate pattern 120, a dielectric film 122, for example, comprising oxide/nitride/oxide (ONO) is formed the resultant structure. The dielectric film may be formed by a thermal oxidation process or by a LPCVD process. If the dielectric film 122 is formed by a LPCVD process, the annealing is performed in NO or $N_2O$ atmosphere in order to achieve the same characteristics as those achieved by a thermal oxide film.

A third conductive layer including a polysilicon layer doped with N+ type and a metal silicide layer such as WSix, TiSix, CoSix, TaSix are deposited thereon, in other words, the control gate layer is then formed. Preferably, the polysilicon layer of the control gate layer 124 is formed to have a thickness of 1000 Å, the metal silicide layer is formed to have a thickness of 100~1500 Å.

Then, after patterning the control gate layer 124 by a photolithography process, a stacked type floating gate of memory cell is formed by dry etching the exposed dielectric film 122, the second floating gate pattern 120 and the first floating gate pattern 104 sequentially in a cell unit. Here, the dry etching process is performed until the upper surface between the field oxide layer 118 and the substrate 100 is exposed.

According to the present invention, as the hard mask layer which exists on the stopper layer comprised of nitride and is comprised of oxide or oxynitride (SiON) is removed before the gap filling oxide film is deposited after the trench is etched using a hard mask, a gap filling margin can be obtained by decreasing the aspect ratio of the trench region. Therefore, gap filling without a void can be accomplished and occurrence of an isolation failure can be prevented by increasing the depth of the trench.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A shallow trench isolation method comprising the steps of:
    (a) forming an oxide film on a semiconductor substrate;
    (b) forming a silicon nitride stopper layer on the oxide film;
    (c) forming an oxide hard mask layer on the stopper layer;
    (d) forming a hard mask layer pattern, a stopper layer pattern and an oxide film pattern by patterning the hard mask layer, the stopper layer and the oxide film;
    (e) forming a trench by etching an upper portion of the substrate using the hard mask layer pattern;
    (f) removing the hard mask layer using a dry etching process; and
    (g) forming a field oxide film in the trench.

2. The method of claim 1, wherein the dry etching process is performed under a condition such that an etching selectivity of oxide with respect to both silicon and silicon nitride is more than about 10:1.

3. A shallow trench isolation method comprising the steps of:
    (a) forming an oxide film on a semiconductor substrate;
    (b) forming a stopper layer on the oxide film;
    (c) forming a silicon oxynitride hard mask layer on the stopper layer;
    (d) forming a hard mask layer pattern, a stopper layer pattern and an oxide film pattern by patterning the hard mask layer, the stopper layer and the oxide film;
    (e) forming a trench by etching an upper portion of the substrate using the hard mask layer pattern;
    (f) removing the hard mask layer; and
    (g) forming a field oxide film in the trench.

4. The method of claim 3, wherein step (f) is performed as a wet etching process.

5. A method for manufacturing a non-volatile memory device, comprising the steps of:
(a) forming an oxide film as a gate oxide film on a semiconductor substrate;
(b) forming a first conductive layer for a floating gate on the oxide film;
(c) forming a silicon nitride stopper layer on the first conducing layer;
(d) forming an oxide hard mask layer on the stopper layer;
(e) forming a hard mask layer pattern and a stopper layer pattern by patterning the hard mask layer and the stopper layer;
(f) forming a first floating gate pattern and a gate oxide film by etching the first conductive layer and the oxide layer using the hard mask layer pattern;
(g) defining an active region of the substrate by etching the substrate using the hard mask layer pattern to form a trench aligned to the first floating gate pattern;
(h) removing the hard mask layer pattern using a dry etching process;
(i) forming a field oxide film in the trench; and
(j) forming a dielectric film and a control gate layer sequentially on the first floating gate pattern.

6. The method of claim 5, wherein the dry etching process is performed under a condition such that etching selectivity of oxide with respect to both silicon and silicon nitride is more than about 10:1.

7. The method of claim 5, wherein the first conductive layer is formed to have a thickness of about 100–2000 Å.

8. The method of claim 5, prior to forming the dielectric film, further comprising the steps of:
forming a second conductive layer on the first floating gate pattern and the field oxide layer; and
forming a second floating gate pattern by partially removing the second conductive layer on the field oxide layer.

9. A method for manufacturing a non-volatile memory device, comprising the steps of:
(a) forming an oxide film as a gate oxide film on a semiconductor substrate;
(b) forming a first conductive layer for a floating gate on the oxide film;
(c) forming a stopper layer on the first conducing layer;
(d) forming a silicon oxynitride hard mask layer on the stopper layer;
(e) forming a hard mask layer pattern and a stopper layer pattern by patterning the hard mask layer and the stopper layer;
(f) forming a first floating gate pattern and a gate oxide film by etching the first conductive layer and the oxide layer using the hard mask layer pattern;
(g) defining an active region of the substrate by etching the substrate using the hard mask layer pattern to form a trench aligned to the first floating gate pattern;
(h) removing the hard mask layer pattern;
(i) forming a field oxide film in the trench; and
(j) forming a dielectric film and a control gate layer sequentially on the first floating gate pattern.

10. The method of claim 9, wherein step (h) is performed as a wet etching process.

11. A shallow trench isolation method comprising the steps of:
(a) forming an oxide film on a semiconductor substrate;
(b) forming a stopper layer on the oxide film;
(c) forming a hard mask layer on the stopper layer;
(d) forming an anti-reflection layer comprising silicon oxynitride on the hard mask layer;
(e) forming an anti-reflection layer pattern, a hard mask layer pattern, a stopper layer pattern, and an oxide film pattern by patterning the anti-reflection layer, the hard mask layer, the stopper layer and the oxide film;
(f) forming a trench by etching an upper portion of the substrate using the hard mask pattern as an etching mask, thereby removing the silicon oxynitride anti-reflection layer pattern;
(g) etching the hard mask pattern; and
(h) forming an oxide film in the trench.

12. The method of claim 11 wherein the stopper layer comprises silicon nitride and the hard mask layer comprises an oxide.

13. The method of claim 11 wherein step (g) is performed in a dry etching process.

* * * * *